(12) United States Patent
Pan et al.

(10) Patent No.: US 8,278,702 B2
(45) Date of Patent: Oct. 2, 2012

(54) HIGH DENSITY TRENCH FIELD EFFECT TRANSISTOR

(75) Inventors: James Pan, West Jordan, UT (US); Scott L. Hunt, West Jordan, UT (US); Dean E. Probst, West Jordan, UT (US); Hossein Paravi, Sandy, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 832 days.

(21) Appl. No.: 12/211,654

(22) Filed: Sep. 16, 2008

(65) Prior Publication Data

US 2010/0065904 A1    Mar. 18, 2010

(51) Int. Cl.
    *H01L 29/66*    (2006.01)
(52) U.S. Cl. .............................. 257/330; 257/E29.262
(58) Field of Classification Search .......... 257/E29.201, 257/E29.257, E29.321, E21.384, E21.419, 257/E21.42, E21.418, E21.383, 330–333, 257/E21.629, E29.262, E29.121; 438/270, 438/273, 277
See application file for complete search history.

(56) References Cited

U.S. PATENT DOCUMENTS

| | | | |
|---|---|---|---|
| 6,489,204 B1 | 12/2002 | Tsui | |
| 7,049,668 B1 | 5/2006 | Hshieh | |
| 7,271,048 B2 | 9/2007 | Chang et al. | |
| 7,323,386 B2 | 1/2008 | Yilmaz | |
| 7,323,745 B2 | 1/2008 | Kinzer | |
| 7,402,863 B2 * | 7/2008 | Jones | 257/331 |
| 7,989,293 B2 * | 8/2011 | Blanchard et al. | 438/270 |
| 2001/0022379 A1 * | 9/2001 | Brush et al. | 257/329 |
| 2003/0068864 A1 * | 4/2003 | Il-Yong et al. | 438/270 |
| 2005/0035402 A1 * | 2/2005 | Venkatraman | 257/330 |
| 2006/0273386 A1 | 12/2006 | Yilmaz et al. | |
| 2008/0265315 A1 * | 10/2008 | Mauder et al. | 257/330 |
| 2009/0179259 A1 * | 7/2009 | Wang et al. | 257/330 |
| 2009/0191678 A1 * | 7/2009 | Yilmaz et al. | 438/270 |
| 2009/0206395 A1 * | 8/2009 | Hshieh | 257/328 |
| 2011/0079844 A1 * | 4/2011 | Hsieh | 257/334 |

* cited by examiner

*Primary Examiner* — Matthew Landau
*Assistant Examiner* — Latanya N Crawford

(57) ABSTRACT

A semiconductor structure comprises trenches extending into a semiconductor region. Portions of the semiconductor region extend between adjacent trenches forming mesa regions. A gate electrode is in each trench. Well regions of a first conductivity type extend in the semiconductor region between adjacent trenches. Source regions of a second conductivity type are in the well regions. Heavy body regions of the first conductivity type are in the well regions. The source regions and the heavy body regions are adjacent trench sidewalls, and the heavy body regions extend over the source regions along the trench sidewalls to a top surface of the mesa regions.

8 Claims, 11 Drawing Sheets

HIGH DENSITY TRENCH FIELD EFFECT TRANSISTOR

BACKGROUND OF THE INVENTION

The present invention relates in general to semiconductor technology, and more particularly, to structures and methods for forming semiconductor devices in shielded and non-shielded gate trench field effect transistors (FETs) with minimum cell pitch.

To increase transistor packing density of trench FETs, it is desirable to minimize the trench width as well as the mesa width (i.e., the spacing between adjacent trenches). However, both of these dimensions are limited by constraints imposed by manufacturing equipment, structural requirements, alignment tolerances, and transistor operational requirements. For example, the minimum width of the mesa region between adjacent trenches is limited by the space required for forming source and heavy body regions. Alignment tolerances associated with forming the trenches and the source and heavy body regions further limit cell pitch reduction.

Many techniques for reducing the cell pitch of trench FETs have been proposed, but none have been able to achieve a substantial reduction in cell pitch without significantly complicating the manufacturing process or adversely impacting transistor performance.

Thus, there is a need for a technique whereby the cell pitch of trench FETs can be reduced while maintaining a simple manufacturing process and superior transistor performance.

BRIEF SUMMARY OF THE INVENTION

In accordance with an embodiment of the invention, a semiconductor structure comprises trenches extending into a semiconductor region. Portions of the semiconductor region extend between adjacent trenches to form mesa regions. A gate electrode is in each trench. Well regions of a first conductivity type extend in the semiconductor region between adjacent trenches. Source regions of a second conductivity type are in the well regions, and heavy body regions of the first conductivity type are in the well regions. The source regions and the heavy body regions are adjacent trench sidewalls, and the heavy body regions extend over the source regions along the trench sidewalls to a top surface of the mesa regions.

In one embodiment, the semiconductor structure further comprises a conductor extending into the trenches to contact the source regions along the trench sidewalls.

In another embodiment, the semiconductor structure further comprises an interconnect layer extending over the semiconductor region and contacting the heavy body regions along the top surface of the mesa regions.

In yet another embodiment, the source regions have portions extending into each trench.

In accordance with another embodiment of the invention, a trench field effect transistor (FET) is formed as follows. Trenches are formed extending into a semiconductor region. Well regions of a first conductivity type are formed in the semiconductor region. Heavy body regions of the first conductivity type are formed in the well regions. The heavy body regions have a higher doping concentration than the well regions, and the heavy body regions abut the trench sidewalls. Source regions of a second conductivity type are formed in the well regions along the trench sidewalls directly below the heavy body regions. A gate electrode is formed in each trench over the dielectric In one embodiment, the source regions overlap the gate electrode along the trench sidewalls.

In another embodiment, the heavy body regions include vertically extending portions that are separated from the trenches by the source regions.

In another embodiment, before the gate electrode is formed, a shield electrode is formed in a bottom portion of each trench, and an inter-electrode dielectric is formed over the shield electrode.

In yet another embodiment, a dielectric layer is formed in each trench over the gate electrode, and a conductor is formed in each trench over the dielectric layer. The conductor contacts the source regions along the trench sidewalls.

The following detailed description and the accompanying drawings provide a better understanding of the nature and advantages of the present invention.

DETAILED DESCRIPTION OF THE INVENTION

In accordance with embodiments of the present invention, trench FET structures with reduced cell pitch are obtained using simple manufacturing processes. Some embodiments include FET structures with source regions under the heavy body regions. Other embodiments include FET structures with a source region inside the trench. Each of these embodiments allows cell pitch to be reduced by moving the source regions away from the surface of the mesa regions, thus allowing a smaller minimum width of the mesa regions. These and other embodiments of the invention as well as other features and advantages are described in more detail below.

It should be understood that the following description is exemplary only, and the scope of the invention is not limited to these specific examples. Note that the dimensions in the figures of this application are not to scale, and at times the relative dimensions are exaggerated or reduced in size to more clearly show various structural features. Additionally, while only one trench is shown in each figure, it is to be understood that the structure illustrated may be replicated many times in a semiconductor device.

Figure 1A:
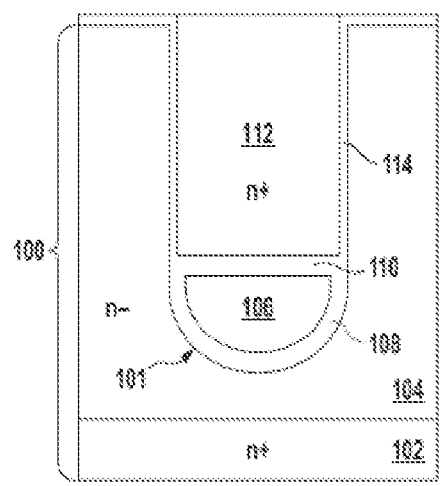
FIGS. 1A-1I are simplified cross-sectional views at various stages of a process for forming a shielded gate trench FET structure with source regions under the heavy body regions, according to an embodiment of the invention.

FIGS. 1A-1I are simplified cross-sectional views at various stages of a process for forming a shielded gate trench FET structure with source regions under the heavy body regions, according to an embodiment of the invention. In FIG. 1A, trench 101 is formed in semiconductor region 100 using conventional photolithography and etch techniques. In one embodiment, semiconductor region 100 includes n-type drift region 104 extending over highly doped n+ type substrate 102. In some embodiments, trench 101 extends into and terminates within drift region 104. In other embodiments, trench 101 extends through drift region 104 and terminates within substrate 102.

Shield dielectric 108, shield electrode 106, inter-electrode dielectric (IED) 110, gate dielectric 114, and gate electrode 112 are formed in trench 101 using known techniques. For example, formation of shield dielectric 108 and shield electrode 106 may include forming a dielectric layer along the sidewalls and bottom of trench 101 using a conventional deposition or thermal oxidation process. A layer of polysilicon may be formed over the dielectric layer using a conventional polysilicon deposition process. The dielectric and polysilicon layers may then be etched using known techniques to recess the layers and form shield dielectric 108 and shield electrode 106 in the bottom portion of trench 101. The formation of IED 110 may include forming a dielectric layer over shield electrode 106 using a conventional dielectric deposition process. One or more conventional dry or wet etch processes may then be used to recess the dielectric and form IED 110. Gate dielectric 114 may be formed along the upper trench sidewalls and over the mesa regions using a conventional deposition or thermal oxidation process. The formation of gate electrode 112 may include forming a polysilicon layer over gate dielectric 114 using a conventional polysilicon deposition process. One or more conventional polysilicon etch or chemical mechanical polishing (CMP) processes may be used to remove the polysilicon from over the mesa regions and form gate electrode 112.

In one embodiment gate electrode 112 may be doped n-type using known techniques. For example, in some embodiments, gate electrode 112 may be doped in situ during the deposition process. In other embodiments, gate electrode 112 may be doped after the deposition process by depositing a doped material over gate electrode 112 and thermally diffusing the dopants into gate electrode 112.

Figure 1B:
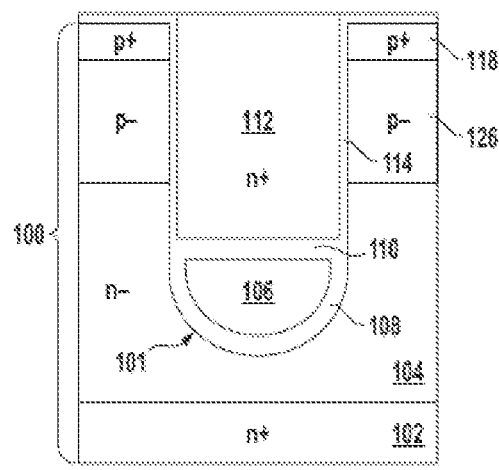
Figure 1C:
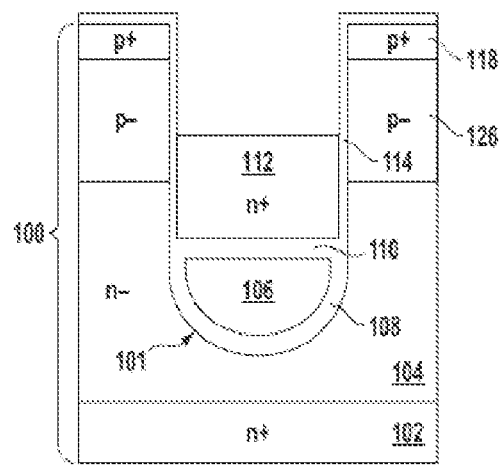
Figure 1D:
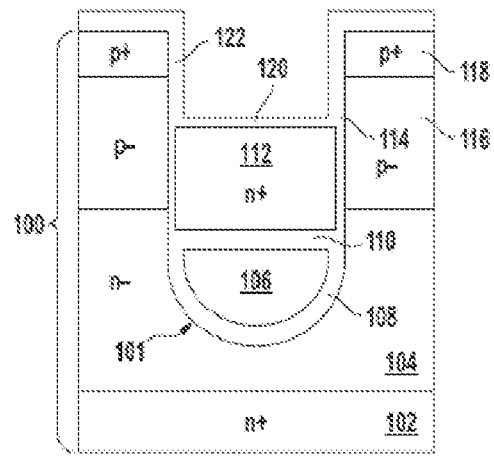

FIGS. 1B-1D illustrate one method of forming well regions 116 and heavy body regions 118 in semiconductor region 100. In other embodiments, well regions 116 and heavy body regions 118 may be formed prior to trench formation using known techniques.

In FIG. 1B, conventional implant processes may be used to implant p-type dopants into an upper portion of semiconductor region 100. In one embodiment, the p-type well implant and the p+ heavy body implant may be blanket implants in the active area. In other embodiments, a mask may be used during the p+ heavy body implant to form periodic heavy body regions.

In FIG. 1C, one or more conventional etch processes may be used to recess gate electrode 112 in trench 101. In some embodiments, gate electrode 112 may be recessed prior to the p-type well implant. In other embodiments, heavy body regions 118 are relatively shallow to minimize out-diffusion of the p-type dopants from heavy body regions 118 to underlying source regions 124 that are formed in subsequent steps. In general, the depth and doping concentration of heavy body regions 118 and the depth to which polysilicon 112 is recessed may be carefully controlled to obtain the desired structural features and device performance.

In FIG. 1D, one or more conventional diffusion processes may be used to activate the p-type dopants and form well regions 116 and heavy body regions 118 adjacent to trench 101. In one embodiment, a thermal diffusion process may be used. The thermal diffusion process may drive the p-type dopants into semiconductor region 100, and also form dielectric 120 over gate electrode 112 and dielectric 122 along upper trench sidewalls and over mesa surfaces. In some embodiments, dielectric 122 may include a portion of gate dielectric 114 and thus be thicker than dielectric 120. In some embodiments, dielectrics 120, 122 may be removed following the formation of well regions 116 and heavy body regions 118.

Figure 1E:
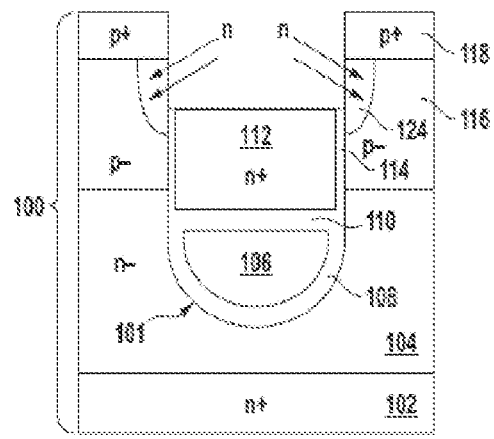

In FIG. 1E, n+ type source regions 124 may be formed under heavy body regions 118 flanking each side of trench 101 using known techniques. In one embodiment, source regions 124 may be formed using one or more conventional angled implant processes at angles of between about 20° to 80°. In some embodiments, source regions 124 may be self aligned and thus formed using a blanket implant in the active area. For example, the bottom of source regions 124 along the sidewalls of trench 101 may depend on the position of the upper surface of gate electrode 112. The top of source regions 124 along the sidewalls of trench 101 may depend on the depth of heavy body regions 118. Heavy body regions 118 may have a high doping concentration and remain p+ conductivity type even though n-type dopants are implanted into heavy body regions 118 during the formation of source regions 124. For example, in one embodiment heavy body regions 118 may be formed using a shallow boron or $BF_2$ implant at a dose of between about $6 \times 10^{15}$-$8 \times 10^{15}$ atoms/cm$^2$ and an energy of between about 20-100 keV, and source regions 124 may be formed using a shallow arsenic implant at a dose of between about $3 \times 10^{15}$-$5 \times 10^{15}$ atoms/cm$^2$ and an energy of between about 20-100 keV. When the source implant is carried out before the heavy body implant, this implant sequence may be reversed.

Figure 1F:
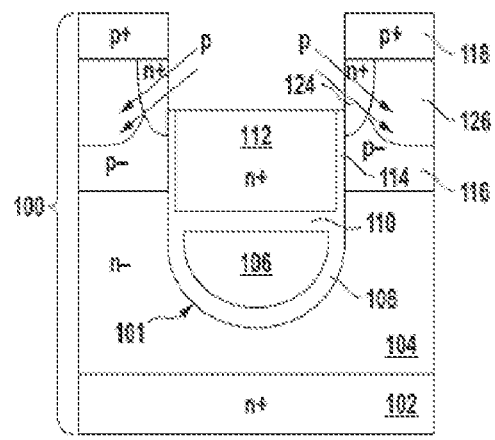

As shown in FIG. 1F, some embodiments may include p+ regions 126 formed adjacent to source regions 124 using known techniques. The dose and energy of p+ regions 126 can be carefully designed in accordance with known techniques to advantageously reduce series resistance. For example, in one embodiment p+ regions 126 may be formed using one or more conventional angled implant processes at angles of between about 7° to 80° to implant boron at a dose of between about $1 \times 10^{14}$-$1 \times 10^{15}$ atoms/cm$^2$ and an energy of between about 20-250 keV.

Figure 1G:
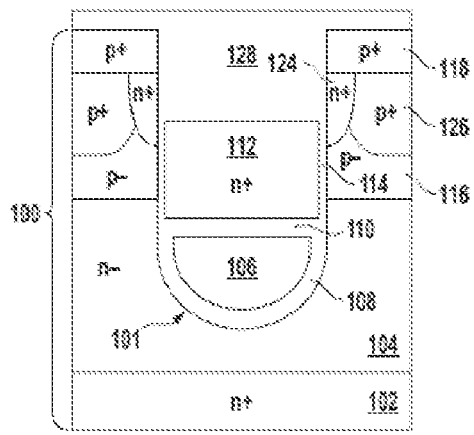
Figure 1H:
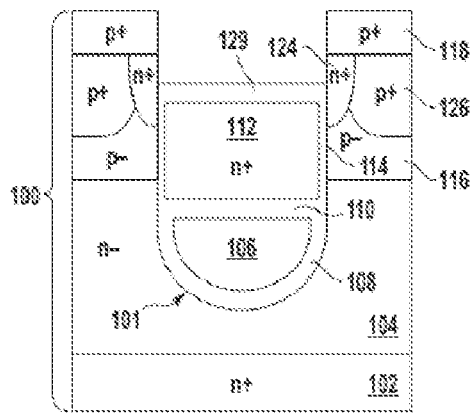

In FIG. 1G, dielectric material 128 may be deposited in the upper portion of trench 101 using known techniques. In one embodiment, a conventional chemical vapor deposition (CVD) process may be used to fill trench 101 with a dielectric material comprising oxide, such as borophosphosilicate glass (BPSG). In FIG. 1H, one or more conventional wet or dry etch processes are used to recess dielectric material 128 in trench 101 to form dielectric layer 129. In some embodiments, portions of source regions 124 are exposed along the trench sidewalls following the recess etch.

Figure 1I:
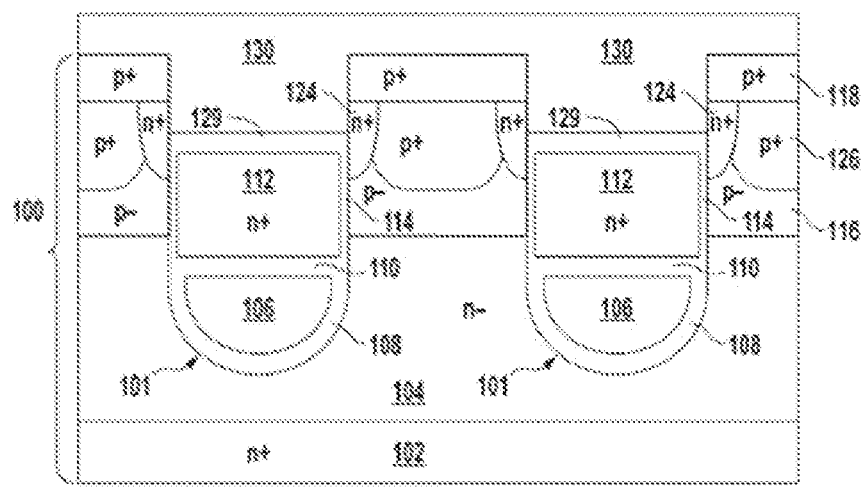

In FIG. 1I, the upper portion of trench 101 may be filled with interconnect layer 130 using known techniques. In one embodiment, interconnect layer 130 may comprise metal and be formed using a conventional metal deposition process. Interconnect layer 130 contacts source regions 124 and heavy body regions 118 along the sidewalls of trench 101, but is isolated from gate electrode 112 by dielectric layer 129. In some embodiments, interconnect layer 130 may contact heavy body regions 118 along the mesa surfaces.

Figure 2:
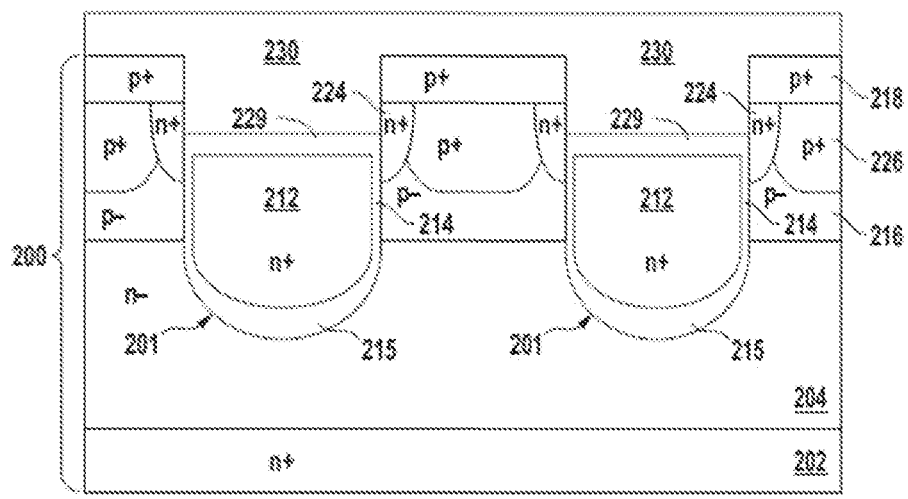
FIG. 2 is a simplified cross-sectional view of a trench-gate FET structure with source regions under the heavy body regions, according to an embodiment of the invention.

FIG. 2 is a simplified cross-sectional view of a trench-gate FET structure with source regions 224 under heavy body regions 218, according to an embodiment of the invention. The trench-gate FET structure shown in FIG. 2 may be formed in a manner similar to that described above with regard to FIGS. 1A-1I, excluding the formation of shield dielectric 108, shield electrode 106, and IED 110. For example, trench 201 may be formed in semiconductor region 200 in a manner similar to that described above with regard to FIG. 1A except that trench 201 may not extend as deep as trench 101 in FIG. 1A. In some embodiments, thick bottom dielectric (TBD) 215 may be formed along the bottom of trench 201 to reduce gate-drain capacitance. Any one of a number of known process techniques for forming TBD may be used. For example, one may use the process steps described in the commonly assigned patent application Ser. No. 12/143,510, titled "Structure and Method for Forming a Thick Bottom Dielectric (TBD) for Trench-Gate Devices," filed Jun. 20, 2008, which is incorporated herein by reference in its entirety.

Gate dielectric 214 and gate electrode 212 may be formed in a manner similar to that described above with regard to FIG. 1A. Heavy body regions 218 and well regions 216 may be formed in a manner similar to that described above with regard to FIGS. 1A-1D. Source regions 224, p+ regions 226, dielectric layer 229, and interconnect layer 230 may be formed in a manner similar to that described above with regard to FIGS. 1E-1I.

As can be seen in FIGS. 1I and 2, positioning source regions 124, 224 under heavy body regions 118, 218 advantageously allows the cell pitch to be reduced. The cell pitch is not limited by the space required for forming the source regions along the surface of the mesa region or by the associated alignment tolerances. In some embodiments, the cell pitch can be reduced by about 25-50% compared to conventional trench FET structures. Also, the trench FET structures illustrated in these figures can be formed using simple manufacturing processes. For example, the source contact is self-aligned, and thus a mask step can be eliminated; the heavy body and well can be annealed at the same time, and thus a separate heavy body anneal can be eliminated; and interconnect layer 130, 230 contacts the heavy body regions along the trench sidewalls and mesa surfaces, and thus formation of heavy body contact openings which typically requires a masking step can be eliminated. Other advantages and features enjoyed by trench FETs formed according to embodiments of the present invention include increased yield (using self-aligned process improves alignment of source and heavy body contacts), lower source contact resistance (no heavy body implant through source contacts; no auto-doping of source contacts from BPSG during heavy body anneal), improved heavy body contact (by contacting the very uniform p++ doped mesa surfaces as well as contacting the heavy body regions along the upper trench sidewalls), scaling of the heavy body contact (due to improved heavy body contact), lower channel resistance, improved threshold voltage and higher breakdown voltage (less diffusion from heavy body region into the channel).

Figure 3A:
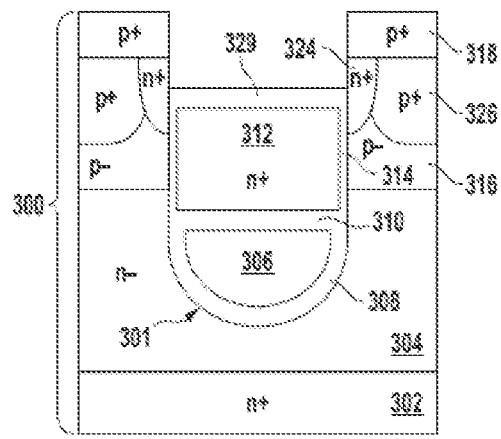
FIGS. 3A-3D are simplified cross-sectional views at various stages of a process for forming a shielded gate trench FET structure with source regions formed inside the trenches, according to another embodiment of the invention.
Figure 3B:
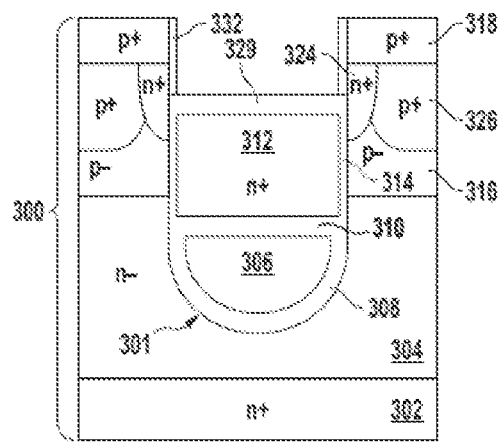
Figure 3C:
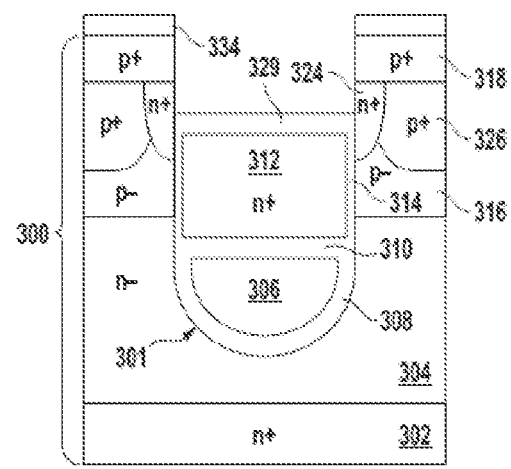
Figure 3D:
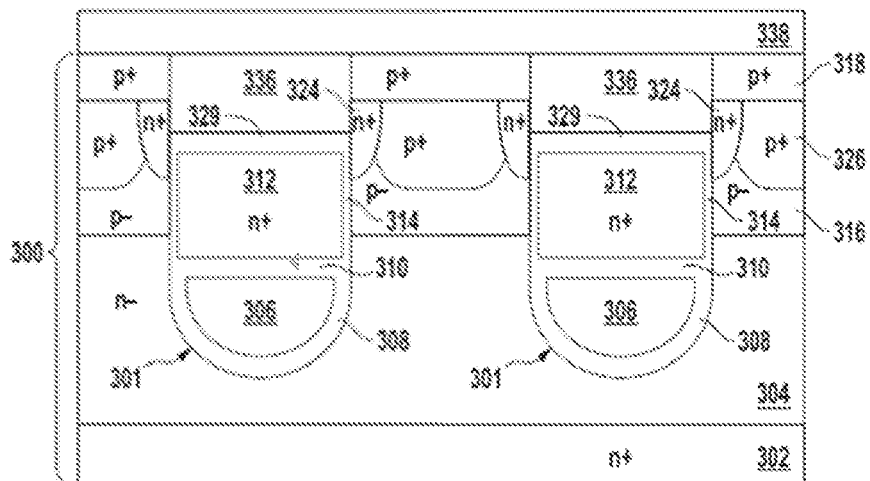

FIGS. 3A-3D are simplified cross-sectional views at various stages of a process for forming a shielded gate trench FET structure with source regions formed inside the trenches, according to another embodiment of the invention. This embodiment may include a conductive material inside the trench serving as part, or all, of the source region, and an interconnect layer covering the structure and contacting the conductive material as shown in FIG. 3D.

The structure illustrated in FIG. 3A may be formed in a manner similar to that described above with regard to FIGS. 1A-1H and thus are not described here in detail. In FIG. 3B, dielectric spacers 332 are formed along the exposed upper sidewalls of trench 301 using known techniques. In one embodiment, spacers 332 comprise nitride and are formed using conventional nitride CVD and spacer etch processes. In some embodiments, a dielectric layer (not shown) may be formed along the upper trench sidewalls prior to the formation of spacers 332 to buffer the stress of spacers 332.

In FIG. 3C, dielectric layer 334 may be formed over the mesa regions adjacent to each trench 301. Spacers 332 prevent formation of a dielectric layer along upper trench sidewalls during this step. In one embodiment, dielectric layer 334 may comprise oxide and be formed using a conventional thermal oxidation process at a temperature of between 800-1000° C. The low-temperature may minimize dopant out-diffusion from well regions 316 and heavy body regions 318. The oxidation process may increase the thickness of dielectric layer 329 over gate electrode 312. This can be compensated for during the recess etch corresponding to the process step illustrated by FIG. 1H. Following formation of dielectric layer 334, spacers 332 may be removed to expose upper trench sidewalls. In one embodiment, spacers 332 are removed using a conventional hot phosphoric acid etch.

In FIG. 3D, conductive material 336 may be formed in trench 301 using known techniques. In one embodiment, conductive material 336 comprises polysilicon and may be deposited using a conventional polysilicon deposition process. The polysilicon may be doped e.g., n-type, using known techniques. For example, in one embodiment the polysilicon is doped in situ using a conventional in situ deposition process. One or more conventional etch and/or CMP processes (e.g., using dielectric 334 as an etch stop) may be used to remove the portions of the polysilicon extending outside trench 301. In some embodiments, the polysilicon may be slightly recessed into trench 301. Dielectric layer 334 may protect the mesa surfaces during the polysilicon removal process. Dielectric layer 334 may be removed using conventional etch and/or CMP processes. In other embodiments, conductive material 336 may comprise silicon and be formed using a conventional selective epitaxial deposition process. In some embodiments, conductive material 336 may be doped in situ with n-type dopants, such as phosphorus and/or arsenic.

Interconnect layer 338 may be formed over the structure using known techniques. In one embodiment, interconnect layer 338 may comprise metal and be formed using conventional metal deposition processes. Interconnect layer 338 may contact heavy body regions 318 along the mesa surfaces as well as the top surface of conductive material 336. In one embodiment, source regions 324 may be formed by out-diffusing dopants (e.g., phosphorous) from conductive material 336 into well regions 314 using known techniques, rather than by the angled source implant as shown in FIG. 1E.

Figure 4:
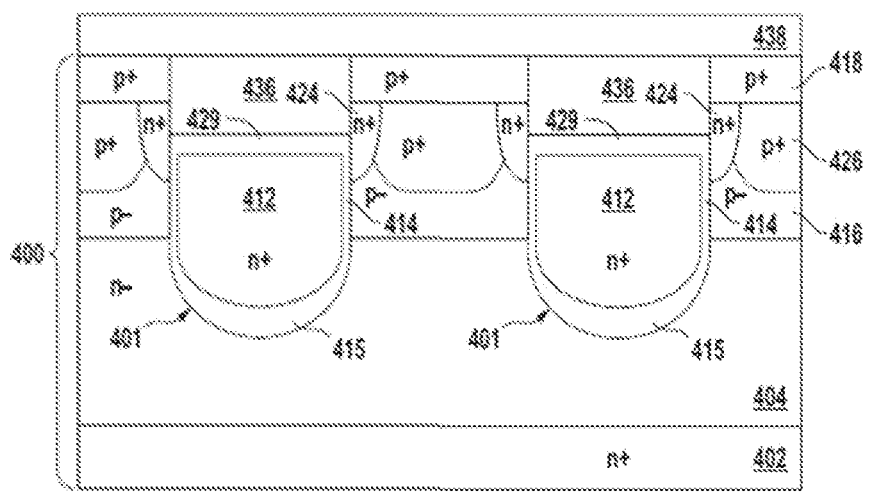
FIG. 4 is a simplified cross-sectional view of a trench-gate FET structure with source regions formed inside the trenches, according to another embodiment of the invention.

FIG. 4 is a simplified cross-sectional view of a trench-gate FET structure with source regions formed inside the trenches, according to another embodiment of the invention. Trench 401, TBD 415, gate dielectric 414, and gate electrode 412, may be formed in a manner similar to that described above with regard to FIG. 2. Source regions 424, p+ regions 426, and dielectric layer 429 may be formed in a manner similar to that described above with regard to FIGS. 3A-3D. The remaining portions of the trench-gate FET structure illustrated in FIG. 4 may also be formed in a manner similar to that described above with regard to FIGS. 3A-3D.

FIGS. 5A-5L are simplified cross-sectional views at various stages of a process for forming a shielded gate trench FET structure with source regions formed inside the trenches and under the heavy body regions, according to an embodiment of the invention. FIGS. 5A-5D correspond to previously described FIGS. 1A-1D and thus are not described here in detail.

Figure 5A:
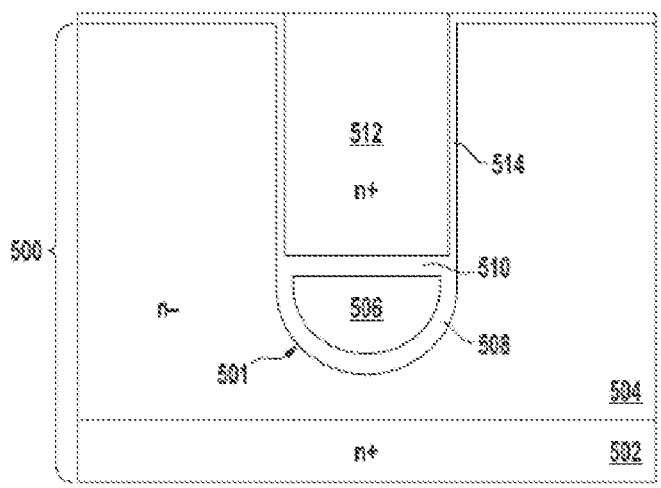
FIGS. 5A-L are simplified cross-sectional views at various stages of a process for forming a shielded gate trench FET structure with source regions formed under the heavy body regions and inside the trenches, according to an embodiment of the invention.
Figure 5B:
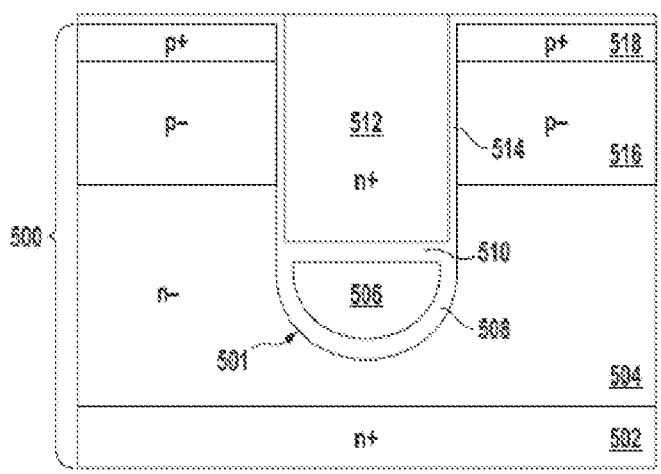
Figure 5C:
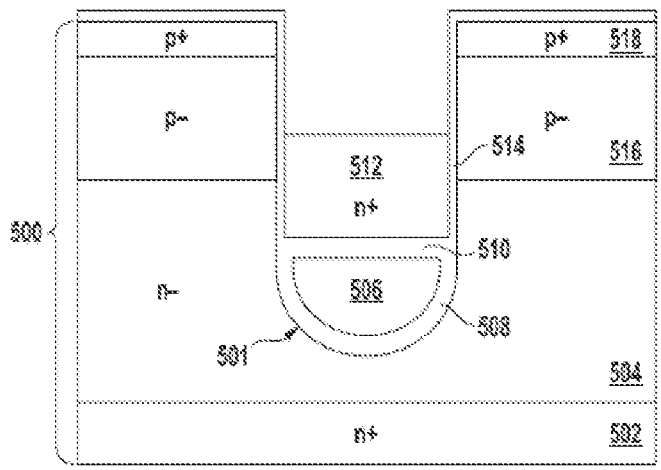
Figure 5D:
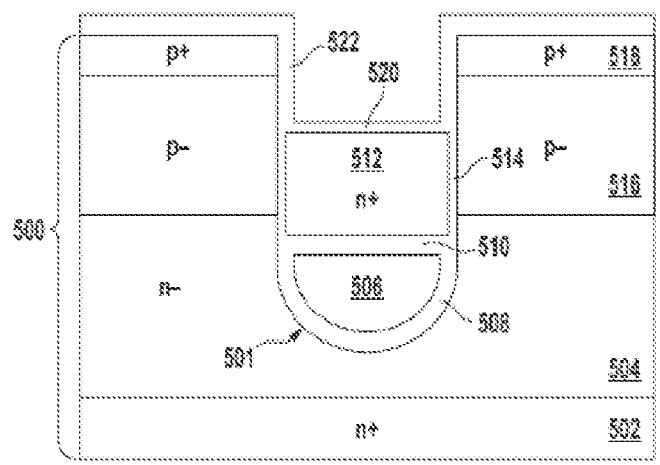
Figure 5E:
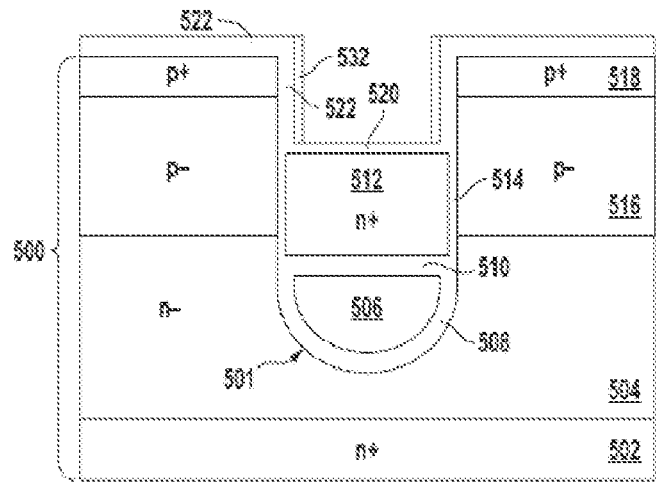

In FIG. 5E, dielectric spacers 532 may be formed along the vertical sidewalls of dielectric 522 using known techniques. In one embodiment, spacers 532 may comprise nitride and be formed using conventional nitride CVD and spacer etch processes.

Figure 5F:
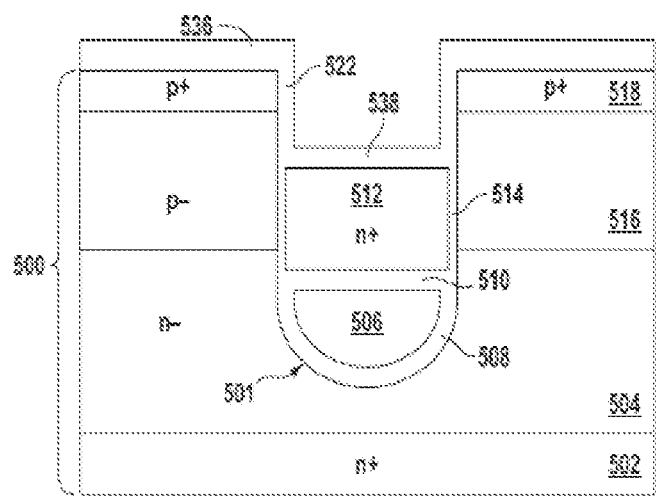

In FIG. 5F, dielectric layer 536 may be formed over the mesa regions adjacent to trench 501, and dielectric layer 538 may be formed over gate electrode 512. In some embodiments, dielectric layers 536, 538 may include portions of dielectric layers 522, 520, respectively. Dielectric spacers 532 protect the portions of dielectric layer 522 extending along upper trench sidewalls during the dielectric formation process. In one embodiment, dielectric layers 536, 538 may comprise oxide and be formed using a conventional thermal oxidation process at a temperature of between 700-800° C. The low-temperature process may minimize dopant out-diffusion from well regions 516 and heavy body regions 518. Spacers 532 prevent oxidation of the mesa along the upper trench sidewalls during the thermal oxidation. Following formation of dielectric layers 536, 538, spacers 532 may be removed using one or more conventional etch processes. In one embodiment, spacers 532 may be removed using a hot phosphoric acid etch.

Figure 5G:
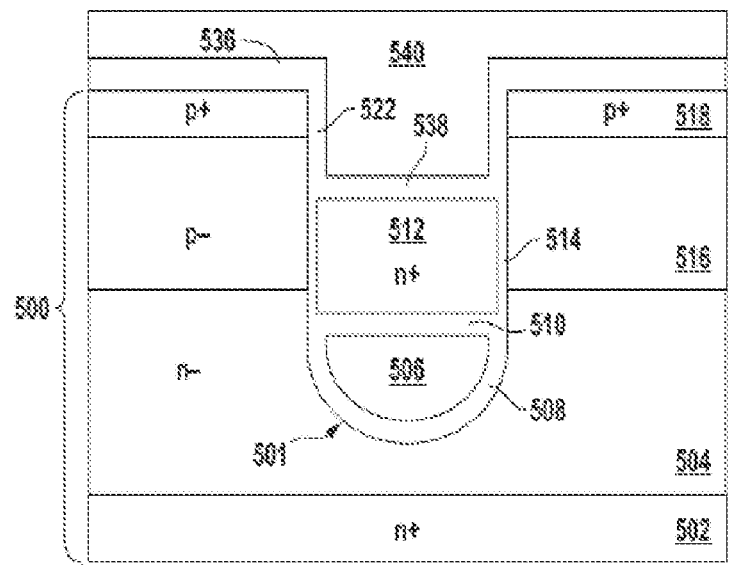
Figure 5H:
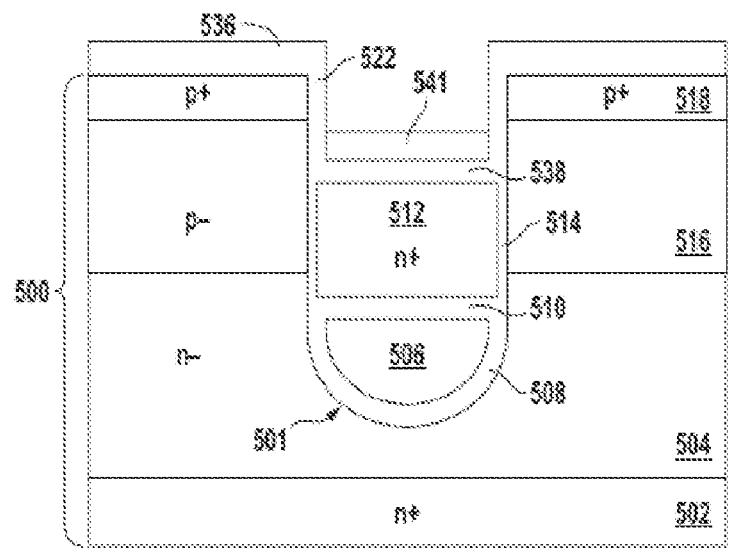

In FIG. 5G, fill material 540 may be formed in an upper portion of trench 501 and over the mesa regions adjacent to trench 501. In one embodiment, fill material 540 comprises polysilicon and may be formed using a conventional polysilicon deposition process. In FIG. 5H, the polysilicon may be recessed in trench 501 using one or more conventional wet or dry etch processes to form sacrificial layer 541. In one embodiment, the upper surface of sacrificial layer 541 may be lower in trench 501 than the bottom surface of heavy body regions 518 for reasons that will become evident from subsequent steps. Dielectric layers 522 and 536 protect the silicon mesa during the polysilicon recess.

Figure 5I:
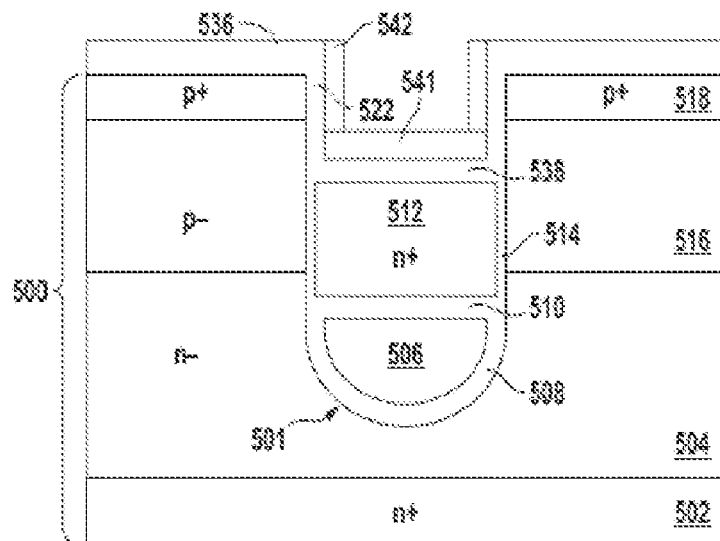

In FIG. 5I, dielectric spacers 542 may be formed along the exposed vertical sidewalls of dielectric layer 522 using known techniques. In one embodiment, spacers 542 may comprise oxide and be formed using conventional oxide deposition and spacer etch processes.

Figure 5J:
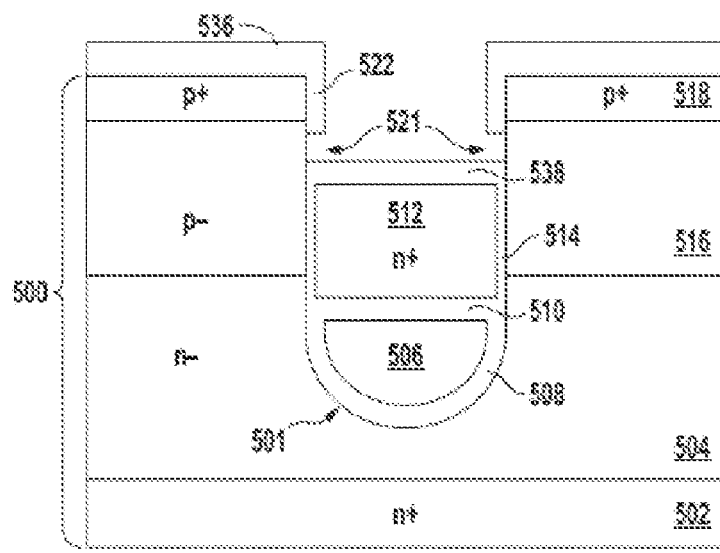

In FIG. 5J, sacrificial layer 541 may be removed using known techniques. In one embodiment, sacrificial layer 541 may be removed using one or more conventional dry isotropic etch and/or wet etch processes. The etch processes may be selective to sacrificial layer 541 so that minimal amounts of spacers 542 and dielectric layers 536, 538 are removed.

The exposed portions of dielectric layer 522 adjacent to sacrificial layer 541 may also be removed to expose small windows 521, through which well regions 616 can be accessed. In one embodiment, dielectric layer 522 may comprise oxide, and windows 521 may be formed by removing the exposed portions of dielectric layer 522 using one or more conventional wet etch processes. At least a portion of spacers 542 and dielectric layers 536, 538 may also be removed. For example, in some embodiments spacers 542 may be completely removed as shown in FIG. 5J. In other embodiments, at least portions of spacers 542 remain. The loss of thickness of dielectric layer 538 can be compensated for when it is first formed to ensure sufficient insulation between gate electrode 512 and source region 544 formed next. Higher voltage devices may require a thicker dielectric layer 538 than lower voltage devices.

Figure 5K:
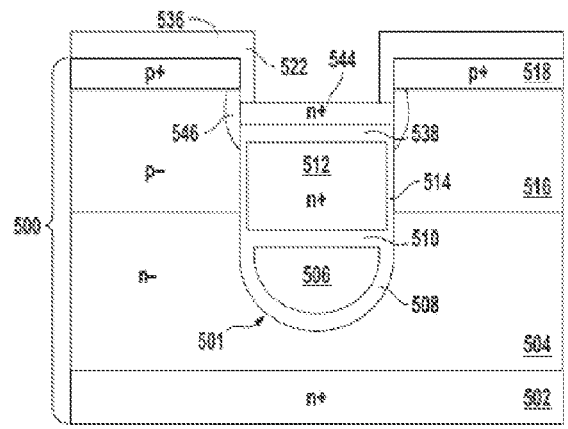

In FIG. 5K, n+ type source region 544 may be formed over dielectric layer 538 using known techniques. Source region 544 contacts the exposed portion of semiconductor region 500 along the sidewalls of trench 501. In one embodiment, source region 544 may comprise polysilicon and be formed using a conventional low-temperature selective CVD deposition process at a temperature of between 500-650° C. In other embodiments, source region 544 may comprise silicon and be formed using a conventional selective epitaxial deposition process. In some embodiments, source region 544 may be doped in situ with n-type dopants, such as phosphorus and/or arsenic.

At least a portion of the n-type dopants in source region 544 may diffuse into well regions 516 to form laterally extending portions 546 of source region 544. In one embodiment, n-type dopants may diffuse into well regions 516 during the deposition of source region 544. In other embodiments, a conventional diffusion process may be used to diffuse n-type dopants from source region 544 into well regions 516. In some embodiments, laterally extending portions 546 may overlap gate electrode 512 along a depth of the trench. The extent of diffusion into well regions 516 can be carefully designed to reduce series resistance. For example, if more out-diffusion is desired, source region 544 may be doped with phosphorous dopants, and where minimal out-diffusion is desired, source region 544 may be doped with arsenic dopants.

Figure 5L:
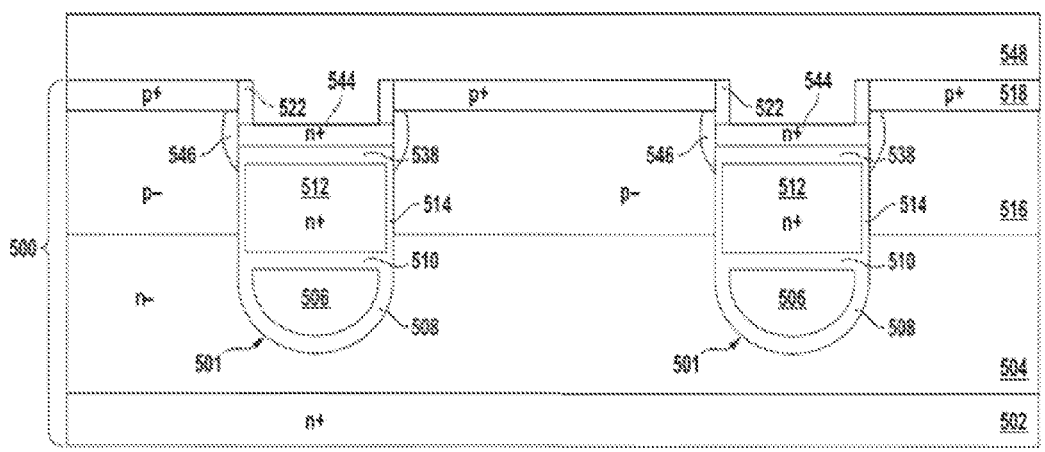

In FIG. 5L, dielectric layer 536 may be removed using conventional etch and/or CMP processes, and the upper portion of trench 501 may be filled with interconnect layer 548 using known techniques. In one embodiment, interconnect layer 548 may comprise metal and be formed using a conventional metal deposition process. Interconnect layer 548 may contact the top surface of source region 544 inside trench 501 and may contact heavy body regions 518 along the surface of the mesa regions. In another embodiment, dielectric layer 522 may also be removed before forming interconnect layer 548 so that interconnect layer 548 makes additional contact to heavy body regions 518 along the upper trench sidewalls.

Figure 6:
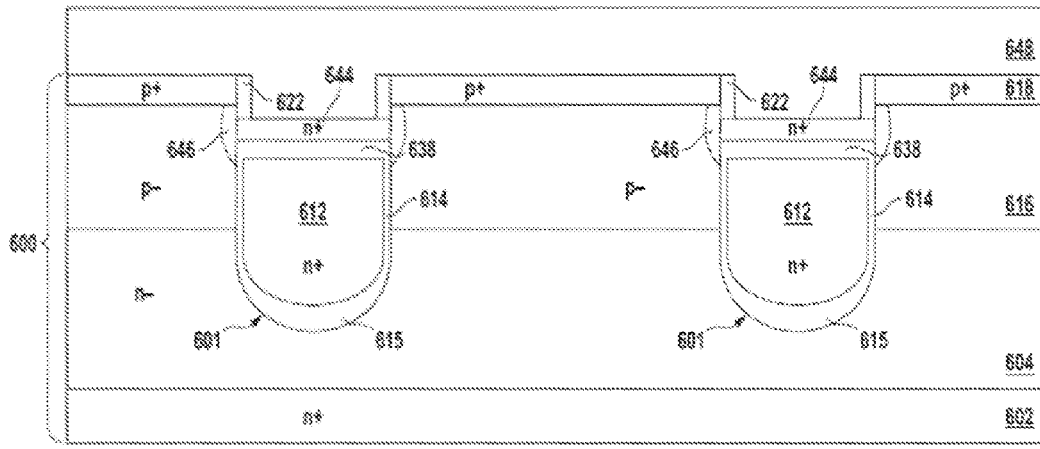
FIG. 6 is a simplified cross-sectional view of a trench-gate FET structure with source regions formed under the heavy body regions and inside the trenches, according to an embodiment of the invention.

FIG. 6 is a simplified cross-sectional view of a trench-gate FET structure with source regions formed inside the trenches and under the heavy body regions, according to an embodiment of the invention. Trench 601, TBD 615, gate dielectric 614, and gate electrode 612 may be formed in a manner similar to that described above with regard to FIG. 2. Source regions 624 and p+ regions 626 may be formed in a manner similar to that described above with regard to FIGS. 1E-1F. The remaining portions of the trench-gate FET structure illustrated in FIG. 6 may be formed in a manner similar to that described above with regard to FIGS. 5E-5L.

Figure 7:
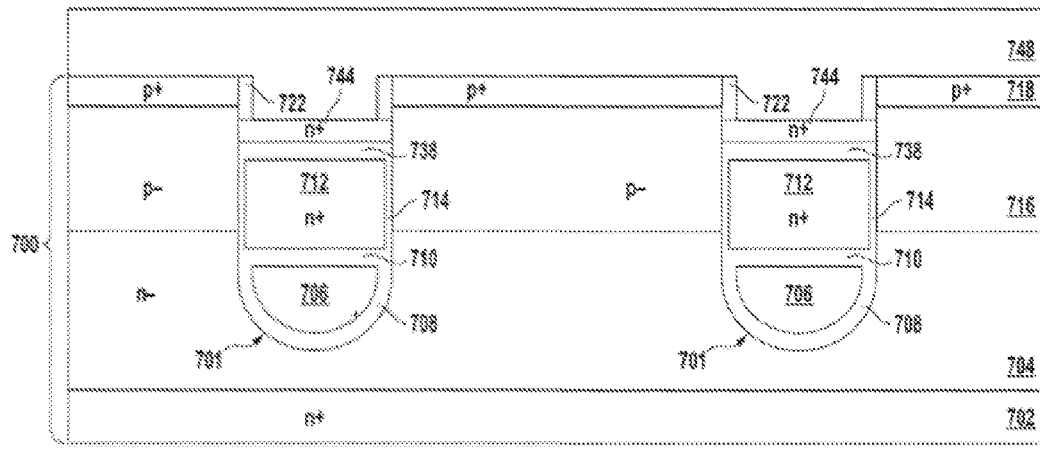
FIG. 7 is a simplified cross-sectional view of a shielded gate trench FET structure with source regions inside the trenches, according to yet another embodiment of the invention.

FIG. 7 is a simplified cross-sectional view of a shielded gate trench FET structure with source regions formed inside the trenches, according to yet another embodiment of the invention. The shielded gate trench FET structure shown in FIG. 7 may be formed in a manner similar to that described above with regard to FIGS. 5A-5L, excluding the formation of laterally extending portions 546. For example, in one embodiment, n-type source region 744 may be doped in situ with arsenic, and due to the low diffusivity of arsenic, very little arsenic may diffuse into well regions 716 during the deposition of source region 744. In another embodiment, prior to forming the interconnect layer 748, a conductive material (not shown) may be formed in the upper portion of trench 701 in a manner similar to that described above with regard to FIG. 3D. Alternatively, a trench-gate FET variation of FIG. 7 may be formed in a manner similar to that described above with regard to FIG. 6.

The trench FET structures shown in FIGS. 5L, 6, and 7 advantageously provide many of the same advantages and features as the structures shown in FIGS. 1I, 2, 3D, and 4 described above. Additionally, the trench FET structures shown in FIGS. 5L and 6 may provide overlap between the laterally extending regions 546, 646 and the gate electrode 512, 612 along a depth of the trench thus reducing parasitic transistor effects. Laterally extending regions 546, 646 may also reduce series resistance. The trench FET structure shown in FIG. 7 may provide a structure with no direct contact between the source and heavy body regions, thus reducing inter-diffusion between the heavy body and source regions.

Note that while the embodiments depicted by FIGS. 1I, 2, 3D, 4, 5L, 6, and 7 show n-channel FETs, p-channel FETs may be obtained by reversing the polarity of the various semiconductor regions. Further, in the embodiment where regions 104, 204, 304, 404, 504, 604, 704 are epitaxial layers extending over substrate 102, 202, 302, 402, 502, 602, 702, respectively, MOSFETs are obtained where the substrate and epitaxial layer are of the same conductivity type, and IGBTs are obtained where the substrate has the opposite conductivity type to that of the epitaxial layer.

Although a number of specific embodiments are shown and described above, embodiments of the invention are not limited thereto. For example, it is understood that the doping polarities of the structures shown and described could be reversed and/or the doping concentrations of the various elements could be altered without departing from the invention. Also, the various embodiments described above may be implemented in silicon, silicon carbide, gallium arsenide, gallium nitride, diamond, or other semiconductor materials. Further, the features of one or more embodiments of the invention may be combined with one or more features of other embodiments of the invention without departing from the scope of the invention.

Therefore, the scope of the present invention should be determined not with reference to the above description but should be determined with reference to the appended claims, along with their full scope of equivalents.

What is claimed is:

1. A semiconductor structure comprising:
   trenches extending into a semiconductor region, portions of the semiconductor region extending between adjacent trenches forming mesa regions;
   a gate electrode in each trench;
   well regions of a first conductivity type extending in the semiconductor region between adjacent trenches;
   source regions of a second conductivity type in the well regions; and
   heavy body regions of the first conductivity type in the well regions, wherein the source regions and the heavy body regions are adjacent trench sidewalls, and the heavy body regions extend directly over the source regions along the trench sidewalls and to a top surface of the mesa regions.

2. The semiconductor structure of claim 1 further comprising:
   a conductor extending into the trenches to contact the source regions along the trench sidewalls.

3. The semiconductor structure of claim 1 further comprising:
   an interconnect layer extending over the semiconductor region and contacting the heavy body regions along the top surface of the mesa regions.

4. A semiconductor structure comprising:
   trenches extending into a semiconductor region, portions of the semiconductor region extending between adjacent trenches forming mesa regions;
   a gate electrode in each trench;
   well regions of a first conductivity type extending in the semiconductor region between adjacent trenches;
   source regions of a second conductivity type in the well regions;
   heavy body regions of the first conductivity type in the well regions, wherein the source regions and the heavy body regions are adjacent trench sidewalls, and the heavy body regions extend over the source regions along the trench sidewalls and to a top surface of the mesa regions, and
   an interconnect layer extending over the semiconductor region and contacting the heavy body regions along the top surface of the mesa regions.

5. A trench field effect transistor (FET) comprising:
   trenches extending into a semiconductor region;
   well regions of a first conductivity type extending in the semiconductor region between adjacent trenches;
   heavy body regions of the first conductivity type extending over the well regions and abutting sidewalls of adjacent trenches, wherein a doping concentration of the heavy body regions is greater than a doping concentration of the well regions;
   source regions of a second conductivity type abutting the trench sidewalls, the source region being embedded in the well regions below at least a portion of the heavy body regions; and
   a gate electrode in each trench, the gate electrode being insulated from the well regions, the heavy body regions, and the source regions by a dielectric.

6. The trench FET of claim 5 wherein the source regions overlap the gate electrode along the trench sidewalls.

7. The trench FET of claim 5 wherein the heavy body regions include vertically extending portions that are separated from the trenches by the source regions.

8. The trench FET of claim 5 further comprising:
   a shield electrode in each trench under the gate electrode; and
   an inter-electrode dielectric extending between the shield electrode and the gate electrode.

* * * * *